US012749527B2

(12) United States Patent
Lin et al.

(10) Patent No.: US 12,749,527 B2
(45) Date of Patent: Sep. 29, 2026

(54) STATIC RANDOM ACCESS MEMORY AND MANUFACTURING METHOD THEREOF

(71) Applicant: UNITED MICROELECTRONICS CORP., Hsin-Chu City (TW)

(72) Inventors: Chun-Cheng Lin, Kaohsiung City (TW); Chun-Hsien Huang, Tainan City (TW); Jun-Jie Wang, Changhua County (TW); Yu-Tse Kuo, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 102 days.

(21) Appl. No.: 18/929,596

(22) Filed: Oct. 28, 2024

(65) Prior Publication Data

US 2026/0088077 A1 Mar. 26, 2026

(30) Foreign Application Priority Data

Sep. 23, 2024 (TW) ................................ 113136003

(51) Int. Cl.

*G11C 11/41* (2006.01)
*G11C 11/412* (2006.01)
*G11C 11/419* (2006.01)
*H10B 10/00* (2023.01)

(52) U.S. Cl.

CPC .......... *G11C 11/412* (2013.01); *G11C 11/419* (2013.01); *H10B 10/12* (2023.02)

(58) Field of Classification Search

CPC ...... G11C 11/412; G11C 11/419; H10B 10/12
See application file for complete search history.

(56) References Cited

U.S. PATENT DOCUMENTS 8,144,540 B2 3/2012 Liaw
8,330,227 B2 * 12/2012 Hung .................. H10D 30/797 257/369
2011/0198699 A1 8/2011 Hung
2021/0313333 A1 10/2021 Liaw
2022/0383943 A1 12/2022 Wang
2023/0017584 A1 * 1/2023 Liaw .................. H10D 30/6735

FOREIGN PATENT DOCUMENTS

TW 201338163 A 9/2013
TW 201839916 A 11/2018
TW 201947767 A 12/2019
TW 202211390 A 3/2022
TW 202418939 A 5/2024
TW 202435699 A 9/2024

* cited by examiner

*Primary Examiner* — Xiaochun L Chen
(74) *Attorney, Agent, or Firm* — Winston Hsu

(57) ABSTRACT

The invention provides a static random access memory, which includes at least a first pull-up transistor (PU1), a first pull-down transistor (PD1), a second pull-up transistor (PU2), a second pull-down transistor (PD2), a first access transistor (PG1), a second access transistor (PG2), a first read port transistor (RPD) and a second read port transistor (RPD). Wherein the gate structures of the first pull-down transistor (PD1) and the second access transistor (PG2) each include a P type work function metal layer, and an N type work function metal layer is located on the P type work function metal layer in the gates of the first pull-down transistor (PD1) and the second access transistor (PG2).

16 Claims, 5 Drawing Sheets

STATIC RANDOM ACCESS MEMORY AND MANUFACTURING METHOD THEREOF

BACKGROUND OF THE INVENTION

1. Field of the Invention

The invention relates to a static random access memory (SRAM), in particular to a structure of a static random access memory with balanced current.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The invention provides a static random access memory, which at least comprises a substrate, wherein a plurality of fin structures are located on the substrate, and a plurality of gate structures are located on the substrate and span the plurality of fin structures, so as to form a plurality of transistors distributed on the substrate, wherein each transistor comprises a part of gate structures spanning a part of the fin structures, wherein a plurality of transistors comprise a first pull-up transistor (PU1), a first pull-down transistor (PD1), a second pull-up transistor (PU2) and a second pull-down transistor (PD2) to form a latch circuit, and a first access transistor (PG1) and a second access transistor (PG2) are connected to the latch circuit. And a first reading transistor (RPD) and a second reading transistor (RPG) which are connected in series with each other, wherein the gate structure of the first reading transistor (RPD) is connected with the gate structure of the first pull-down transistor (PD1), wherein the first pull-down transistor (PD1), the second pull-down transistor (PD2), the first access transistor (PG1) and the second access transistor (PG2) each comprise a gate structure, wherein the gate structures of the first pull-down transistor (PD1) and the second access transistor (PG2) each include a P type work function metal layer, and an N type work function metal layer is located on the P type work function metal layer.

The invention also provides a manufacturing method for forming a static random access memory (SRAM), comprising at least: providing a substrate, forming a plurality of fin structures located on the substrate, forming a plurality of gate structures located on the substrate and span the plurality of fin structures to form a plurality of transistors distributed on the substrate, wherein each transistor comprises a part of the gate structure spanning a part of the fin structure, and the plurality of transistors comprise: a first pull-up transistor (PU1), a first pull-down transistor (PD1), a second pull-up transistor (PU2) and a second pull-down transistor (PD2) together form a latch circuit, a first access transistor (PG1) and a second access transistor (PG2) connected to the latch circuit, and a first reading transistor (RPD) and a second reading transistor (RPG) connected in series, wherein the gate structure of the first reading transistor (RPD) is connected to the gate structure of the first pull-down transistor (PD1), wherein the first pull-down transistor (PD1) and the second access transistor (PG2) each comprise a gate structure, wherein the gate structures of the first pull-down transistor (PD1) and the second access transistor (PG2) each include a P type work function metal layer, and an N type work function metal layer is located on the P type work function metal layer.

The applicant found that there is still room for improvement in the leakage current of the current static random access memory, in which the fin structure spanned by some transistors in the static random access memory is cut off due to the layout pattern, which leads to the difference in the passing currents of the two pull-down transistors in the static random access memory, and similarly, the difference in the passing currents of the two access transistors, which leads to the current imbalance of the whole static random access memory and further affects the performance of the static random access memory. By reducing the P type work function metal layer of some N type transistors, the invention further improves the saturation current of some N type transistors. By adjusting the saturation current of some N type transistors, the current of the whole SRAM can be balanced, thus improving the stability and performance of the SRAM.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In order to make the following easier to understand, readers can refer to the drawings and their detailed descriptions at the same time when reading the present invention. Through the specific embodiments in the present specification and referring to the corresponding drawings, the specific embodiments of the present invention will be explained in detail, and the working principle of the specific embodiments of the present invention will be expounded. In addition, for the sake of clarity, the features in the drawings may not be drawn to the actual scale, so the dimensions of some features in some drawings may be deliberately enlarged or reduced.

DETAILED DESCRIPTION

Figure 1:
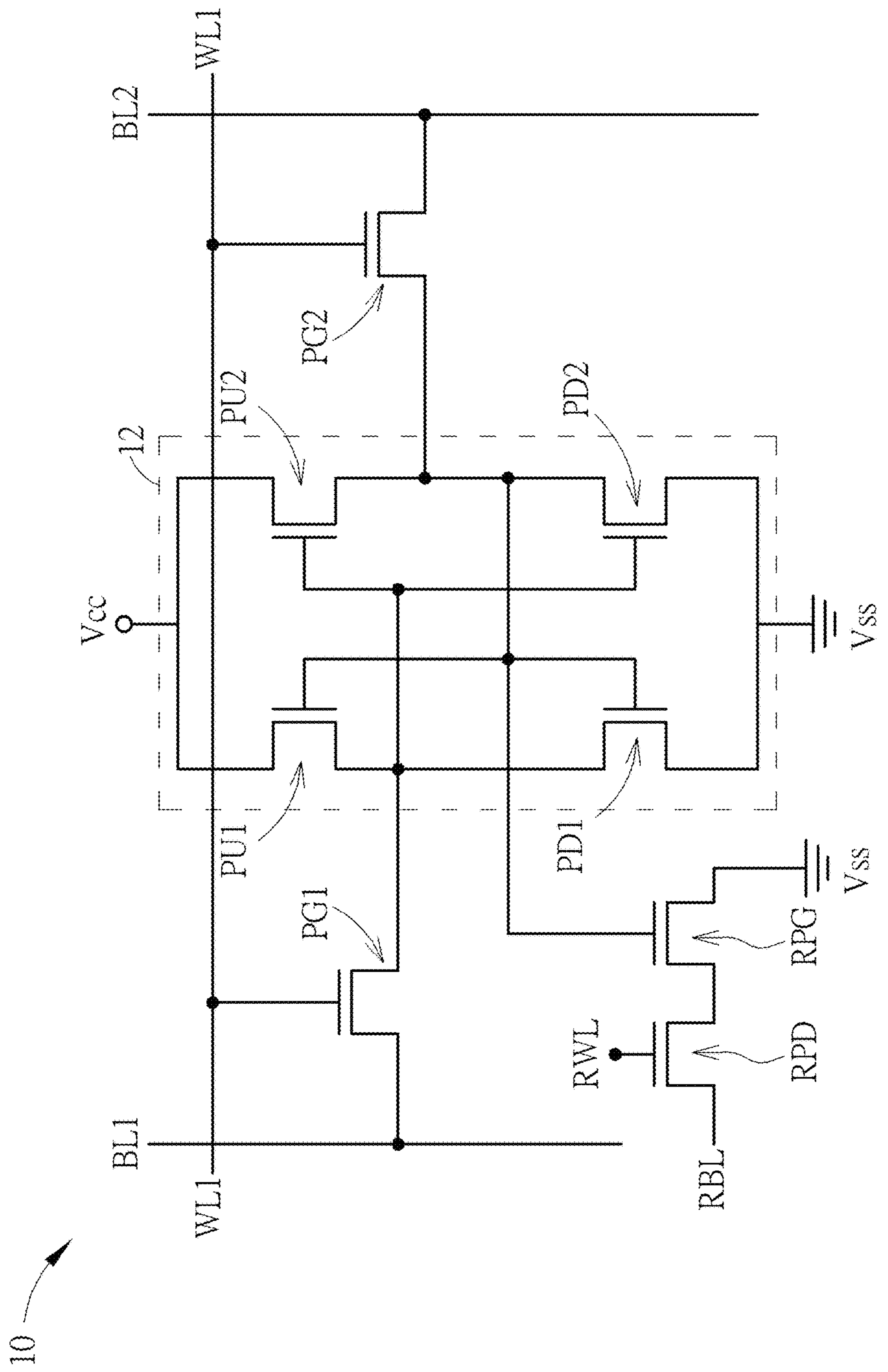
FIG. 1 is a circuit diagram of a group of SRAM memory cells in a SRAM according to a first embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Figure 2:
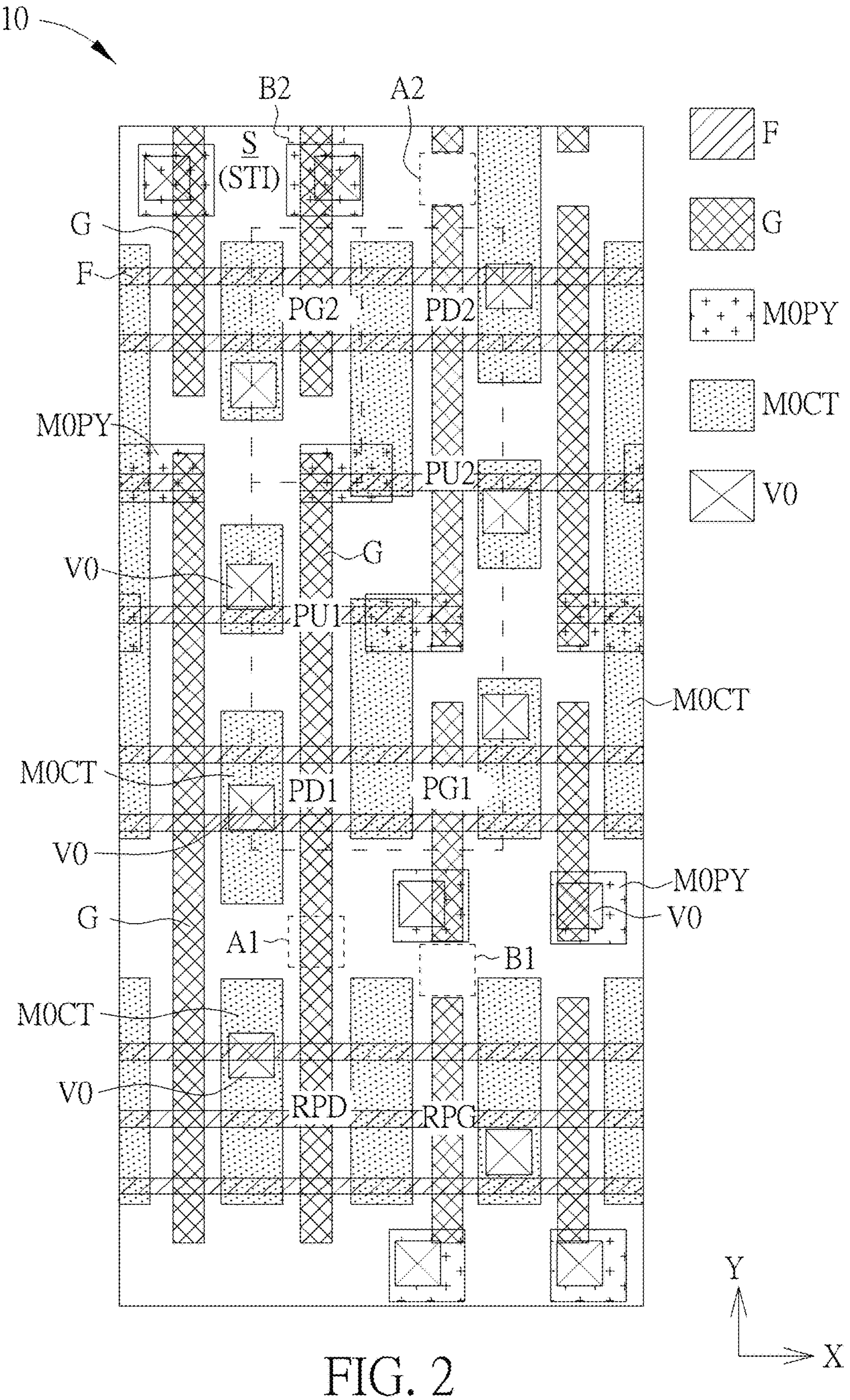
FIG. 2 is a layout diagram of the SRAM of the present invention.

Please refer to FIG. 1 and FIG. 2. FIG. 1 is a circuit diagram of a group of SRAM memory cells in a SRAM according to a first embodiment of the present invention. FIG. 2 is a layout diagram of a static random access memory of the present invention.

In this embodiment, it includes at least one 8-transistor register file SRAM (8TRF-SRAM) memory cell 10. The 8TRF-SRAM memory cell 10 is preferably composed of a first Pull-Up transistor PU1, a second pull-up transistor PU2, a first pull-down transistor PD1, a second pull-down transistor PD2, a first access transistor PG1, a second access transistor PG2, a first reading transistor RPD and a second reading transistor RPG, wherein the first reading transistor RPD and the second reading transistor RPG are connected in series. The first pull-up transistor PU1 and the second pull-up transistor PU2, the first pull-down transistor PD1 and the second pull-down transistor PD2 form a latch circuit 12, so that data can be latched at a storage node. In addition, in this embodiment, a source region of each of the first pull-up transistor PU1 and the second pull-up transistor PU2 is electrically connected to a voltage source Vcc, and a drain region of each of the first pull-down transistor PD1 and the second pull-down transistor PD2 is electrically connected to a voltage source Vss.

As for the gates of the first access transistor PG1 and the second access transistor PG2, they are coupled to the word line WL1, while the source of the first access transistor PG1 and the second access transistor PG2 are respectively coupled to the corresponding first bit line BL1 and second bit line BL2. In addition, the gate of the first reading transistor RPD is connected to a reading word line RWL, the source of the first reading transistor RPD is connected to a reading bit line RBL, the gate of the reading transistor RPD is connected to the latch circuit 12, and the drain of the reading transistor RPD is connected to the voltage source Vss.

FIG. 2 is a layout diagram of a static random access memory of the present invention. In this embodiment, as shown in FIG. 2, the 8TRF-SRAM memory cell 10 is disposed on a substrate S, such as a silicon substrate or a silicon-on-insulator (SOI) substrate. The substrate S can be a planar structure or provided with a plurality of fin structures F, and a plurality of gate structures G are located on the substrate S. In other embodiments of the present invention, it can also be applied to planar SRAM, which means that it is not necessary to form fin structures on the substrate, but to form doped regions in the substrate, which is also within the scope of the present invention.

In addition, the layout of FIG. 2 also includes a plurality of metal layers, in which the metal layers partially connecting the gates of transistors are defined as M0PY, and the metal layers connecting the source/drain of transistors is defined as M0CT. In FIG. 2, the metal layers M0PY and the metal layers M0CT are respectively represented by different patterns. In fact, the difference between the metal layer M0PY and the metal layer M0CT lies in the different connected elements. However, both of them actually belong to the metal layers and can contain the same material, but they are not limited to this. FIG. 2 also includes a plurality of contact plugs (via)V0, wherein the contact plugs V0 are used to connect the metal layers M0PY and M0CT to other conductive layers (such as M1, V1, M2, etc., which are common in the semiconductor manufacturing process).

In the layout pattern of the present invention, a three-dimensional SRAM is taken as an example (that is, fin structures F are formed to replace planar doped regions). As shown in FIG. 2, the substrate S is covered with an insulating layer, such as a shallow trench isolation structure (STI), except for the fin structure F, the gate structure G, the connecting structure M0PY, the connecting structure M0CT and the position of the contact V0, so as to isolate electronic components (such as transistors) from short circuit. In addition, each gate structure G straddles a part of the fin structure F to form transistors (for example, the first pull-up transistor PU1, the second pull-up transistor PU2, the first pull-down transistor PD1, the second pull-down transistor PD2, the first access transistor PG1, the second access transistor PG2, the first reading transistor RPD and a second reading transistor RPG). For the sake of clarity, the positions of the above-mentioned transistors are directly marked on the second figure, especially at the intersection of the gate structure G and the fin structure F.

In the first embodiment, the first pull-up transistor PU1, the second pull-up transistor PU2, the first pull-down transistor PD1, the second pull-down transistor PD2, the first access transistor PG1, the second access transistor PG2, the first reading transistor RPD and the second reading transistor RPG each include a gate structure G, the first pull-up transistor PU1 and the second pull-up transistor PU2 are composed of P type metal oxide semiconductor transistors (PMOS), while the first pull-down transistor PD1, the second pull-down transistor PD2, the first access transistor PG1, the second access transistor PG2, the first reading transistor RPD and the second reading transistor RPG are composed of N type metal oxide semiconductor (NMOS). Therefore, from the sectional view, the stacked material layers of each gate structure are different, and the obvious difference is that PMOS transistors usually have an extra P type work function metal layer in the stacked material layer of the gate compared with NMOS transistors.

Figure 3:
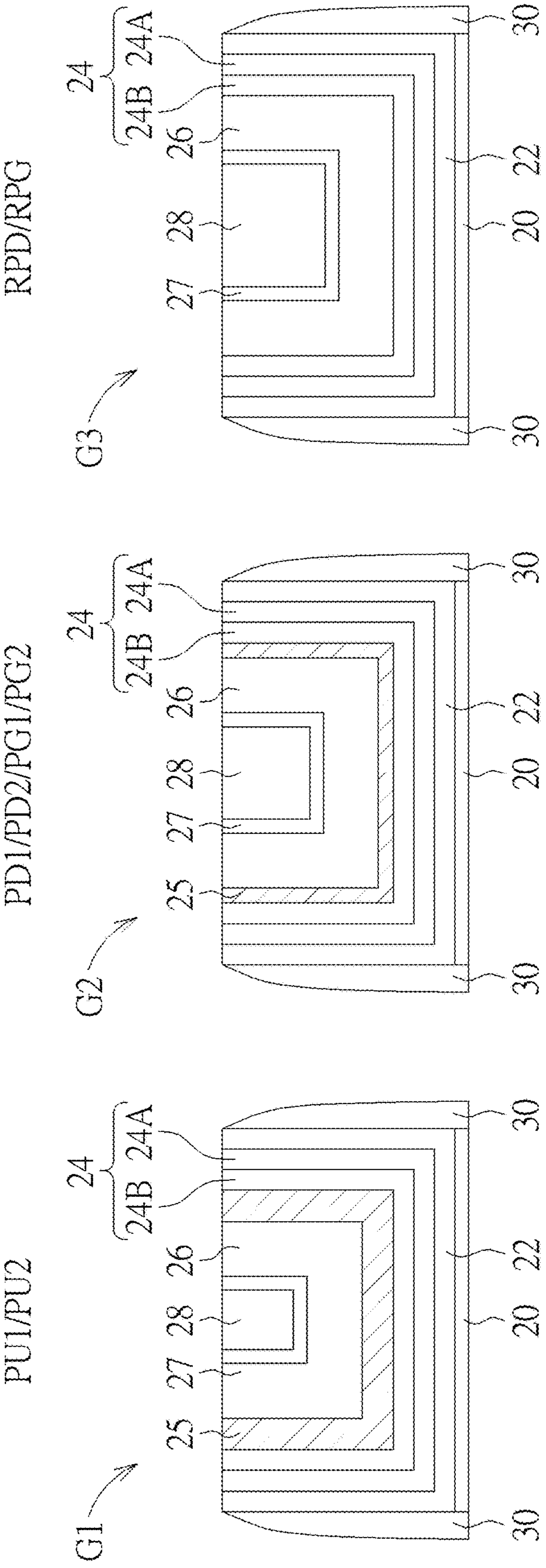
FIG. 3 is a schematic cross-sectional view of the gates of a pull-up transistor, a pull-down transistor/an access transistor and a read transistor according to the first embodiment of the present invention.

In more detail, please refer to FIG. 3, which shows a schematic cross-sectional view of the gates of a pull-up transistor, a pull-down transistor/an access transistor and a read transistor according to the first embodiment of the present invention.

In FIG. 3, "PU1/PU2" represents the first pull-up transistor and/or the second pull-up transistor, and in FIG. 3, a gate structure G1 represents the gate structure of the above transistors; "PD1/PD2" stands for the first pull-down transistor and/or the second pull-down transistor, while "PG1/PG2" stands for the first access transistor and/or the second access transistor. In FIG. 3, the gate structures of the above transistors (the first pull-down transistor PD1, the second pull-down transistor PD2, the first access transistor PG1 and the second access transistor PG2) are represented by gate structures G2. "RPD/RPG" represents the first reading transistor RPD and the second reading transistor RPG, and the gate structure of the above transistors is represented by the gate structure G3 in FIG. 3. For simplicity, some components such as substrate, dielectric layer, shallow trench isolation, source/drain regions are not shown, but those skilled in the art should know that these components exist in the semiconductor structure of the present invention.

As shown in FIG. 3, the gate structure G1, the gate structure G2 and the gate structure G3 each include a gate dielectric layer 20, a high dielectric constant (high-k) layer 22, a bottom barrier layer 24, an N type work function metal layer 26, a diffusion barrier layer 27 and an electrode layer 28 stacked from bottom to top, wherein if a gate groove (not shown) is formed in the dielectric layer first, and then the above-mentioned material layers are sequentially formed in the gate groove, then the cross section of each material layer presents a "U" shape. On the other hands, if the above material layers are stacked on a plane, the cross section shows a "-" shape. Next, spacers 30 are included on both sides of the stacked structure.

In this embodiment, the material of the gate dielectric layer 20 is silicon oxide, for example. The high dielectric constant layer 22 can be selected from a dielectric material with a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_1$-$xO_3$, PZT), barium strontium titanate ($BaxSr_1$-$xTiO_3$, BST) or a combination thereof. The bottom barrier layer 24 may include a lower titanium nitride (TiN) layer 24A and an upper tantalum nitride (TaN) layer 24B, wherein the thickness of the titanium nitride (TiN) layer 24A is about 10-20 angstroms, and the thickness of the tantalum nitride (TaN) layer 24B is about 10-20 angstroms. The material of the N type work function metal layer 26 is, for example, titanium aluminide (TiAl), and the thickness of the N type work function metal layer 26 is about 20-60 angstroms. The diffusion barrier layer 27 is made of titanium nitride, for example, and has a thickness of about 10 angstroms. The material of the electrode layer 28 is, for example, tungsten (W) or aluminum (Al). The material of the spacer 30 is, for example, silicon oxide, silicon nitride, silicon oxynitride, etc., but the materials of the above-mentioned material layers are only some examples of the present invention, and the present invention is not limited to this.

Notably, in addition to the above-mentioned gate dielectric layer 20, high dielectric constant layer 22, bottom barrier layer 24, N type work function metal layer 26 and top electrode layer 28, the gate structure G1 (corresponding to the first pull-up transistor PU1 and/or the second pull-up transistor PU2) further includes a P type work function metal layer 25 located between the bottom barrier layer 24 and the N type work function metal layer 26. That is to say, from a cross-sectional view, the tantalum nitride (TaN) layer 24B of the bottom barrier layer 24 in the gate structure G1 directly contacts the P type work function metal layer 25, and the N type work function metal layer 26 also directly contacts the P type work function metal layer 25.

In addition to the gate structure G1 (corresponding to the first pull-up transistor PU1 and/or the second pull-up transistor PU2) including the P type work function metal layer 25, the gate structure G2 (corresponding to the first pull-down transistor PD1, the second pull-down transistor PD2, the first access transistor PG1 and the second access transistor PG2) also includes the P type work function metal layer 25, while the gate structure G3 (corresponding to the first reading transistor RPD and the second reading transistor RPG) does not include the P type work function metal layer 25. In addition, the thickness of the P type work function metal layer 25 in the gate structure G1 is about 16-32 angstroms, while the thickness of the P type work function metal layer 25 in the gate structure G2 is about 8-16 angstroms, that is, the thickness of the P type work function metal layer 25 in the gate structure G1 is greater than the thickness of the P type work function metal layer 25 in the gate structure G2.

In contrast, the gate structure G3 (corresponding to the first reading transistor RPD and the second reading transistor RPG) in this embodiment does not include the P type work function metal layer 25. That is, the tantalum nitride (TaN) layer 24B of the bottom barrier layer 24 in the gate structure G3 directly contacts the N type work function metal layer 26.

The applicant found that in the first embodiment, there is still room for improvement in the leakage current of the 8TRF-SRAM memory cell 10. For example, because the length of the fin structure spanned by each transistor is different, it will affect the saturated drain current (Idsat) of each transistor, so that the first pull-down transistor PD1 and the second pull-down transistor PD2 of the 8TRF-SRAM memory cell 10 have different Idsats. Similarly, the first access transistor PG1 and the second access transistor PG2 have different Idsat.

In more detail, as shown in FIG. 2, the fin structure F spanned by the first pull-down transistor PD1 is connected to the first reading transistor RPD, so the fin structure F is a continuous structure between the first pull-down transistor PD1 and the first reading transistor RPD (as shown in the region A1 of FIG. 2), but the fin structure F spanned by the first pull-down transistor PD1 is not connected to the adjacent 8TRF-SRAM memory cell, so the fin structure F is cut off between the second pull-down transistor PD2 and other memory cells. Similarly, the fin structure spanned by the first access transistor PG1 is cut off between the first access transistor PG1 and the second reading transistor RPG (as shown in the region B1 of FIG. 2), while the fin structure spanned by the second access transistor PG2 is a continuous structure between the second access transistor PG2 and adjacent 8TRF-SRAM memory cell (as shown in the region B2 of FIG. 2). Because the length of the fin structure F spanned by the above transistors is different, the saturated drain current of each transistor will be affected. Specifically, according to the applicant's experiment, the saturated drain current of the first access transistor PG1 is about 10% lower than that of the second access transistor PG2, and the saturated drain current of the second pull-down transistor PD2 is about 10% lower than that of the first pull-down transistor PD1. This causes the current imbalance of the whole 8TRF-SRAM memory cell 10 and affects the quality of the 8TRF-SRAM memory cell 10.

In order to solve the above problems, in other embodiments of the present invention, the applicant proposed a method to reduce the work function metal layer of some transistors, so as to increase the saturated drain current of these transistors, and further make the current of the whole 8TRF-SRAM memory cell 10 more balanced. Please see the following paragraphs for details.

In the following, different embodiments of the SRAM of the present invention will be described, and in order to simplify the description, the following description will mainly focus on the differences of each embodiment, without repeating the similarities. In addition, the same elements in various embodiments of the present invention are labeled with the same reference numerals, so as to facilitate the comparison among various embodiments.

Figure 4:
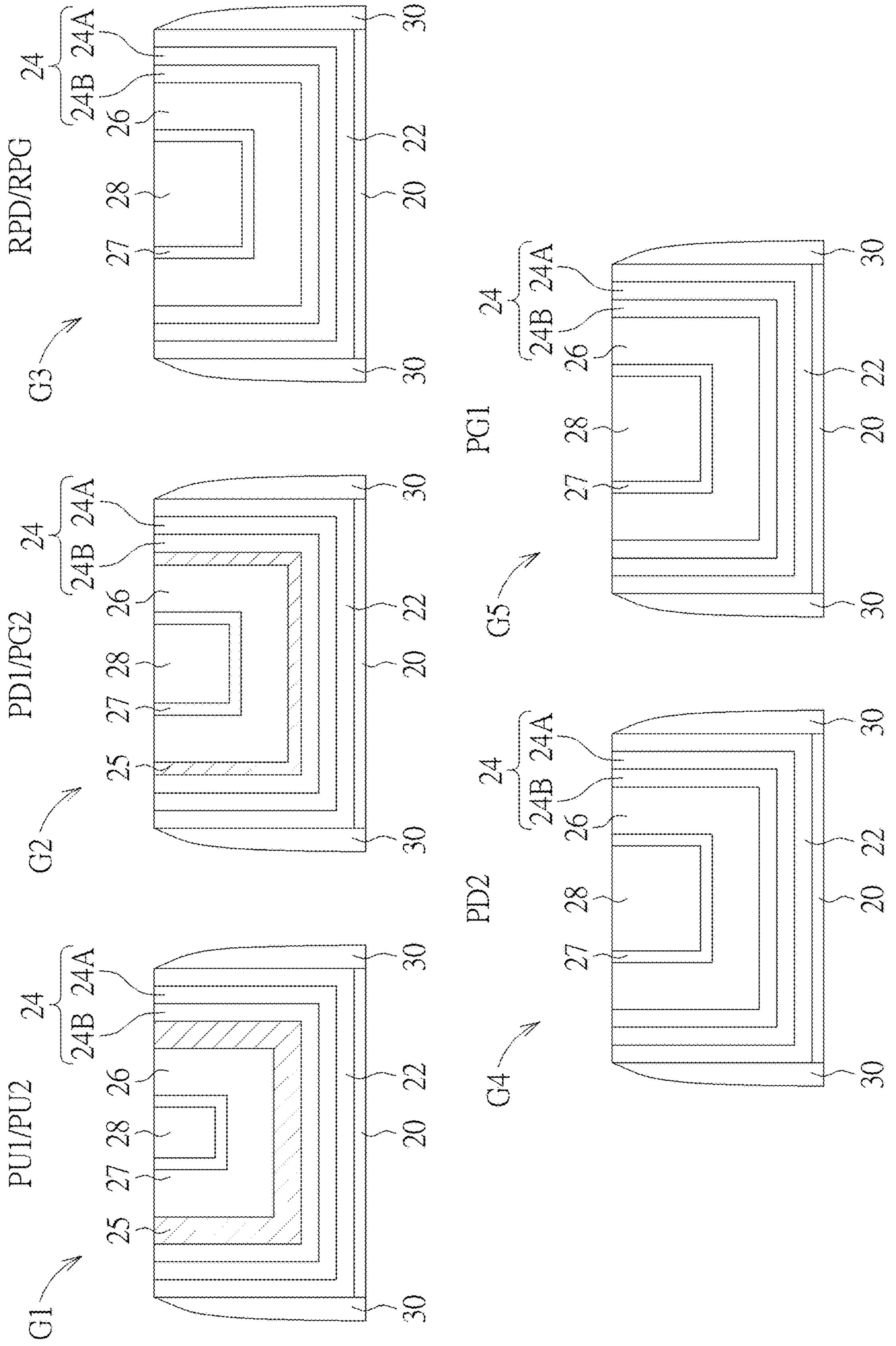
FIG. 4 is a schematic cross-sectional view of the gates of a first/second pull-up transistor, a first pull-down transistor/an second access transistor, an first/second reading transistor, a second pull-down transistor and a first access transistor according to a second embodiment of the present invention.

FIG. 4 is a schematic cross-sectional view of the gates of a first/second pull-up transistor, a first pull-down transistor/ an second access transistor, an first/second reading transistor, a second pull-down transistor and a first access transistor according to a second embodiment of the present invention. As shown in FIG. 4, this embodiment also proposes an 8TRF-SRAM memory cell, and its circuit diagram and layout pattern are the same as those of the first embodiment, so it can be shown with reference to FIG. 1 and FIG. 2, and will not be repeated here.

The difference between this embodiment and the first embodiment is that, because the saturated drain currents of the first access transistor PG1 and the second pull-down transistor PD2 are lower, the P type work function metal layer 25 of the first access transistor PG1 and the second pull-down transistor PD2 is removed in the manufacturing process, but the P type work function metal layer 25 of the second access transistor PG2 and the first pull-down transistor PD1 is still retained. Since the first access transistor PG1 and the second pull-down transistor PD2 are both N type transistors, the P type work function metal layer 25 will suppress their saturated drain current. Conversely, if the P type work function metal layer 25 is removed, the saturated drain current of the N type transistor can be increased.

Therefore, as shown in FIG. 4, after removing the P type work function metal layers 25 of the first access transistor PG1 and the second pull-down transistor PD2, the gate structure of the second pull-down transistor PD2 is defined as the gate structure G4, and the gate structure of the first access transistor PG1 is defined as the gate structure G5. The gate structure G3 (corresponding to the first reading transistor RPD and the second reading transistor RPG), the gate structure G4 (corresponding to the second pull-down transistor PD2) and the gate structure G5 (corresponding to the first access transistor PG1) have the same structure, that is, they do not contain the P type work function metal layer 25, so the tantalum nitride (TaN) layer 24B of the bottom barrier layer 24 directly contacts the N type work function metal layer 26.

Figure 5:
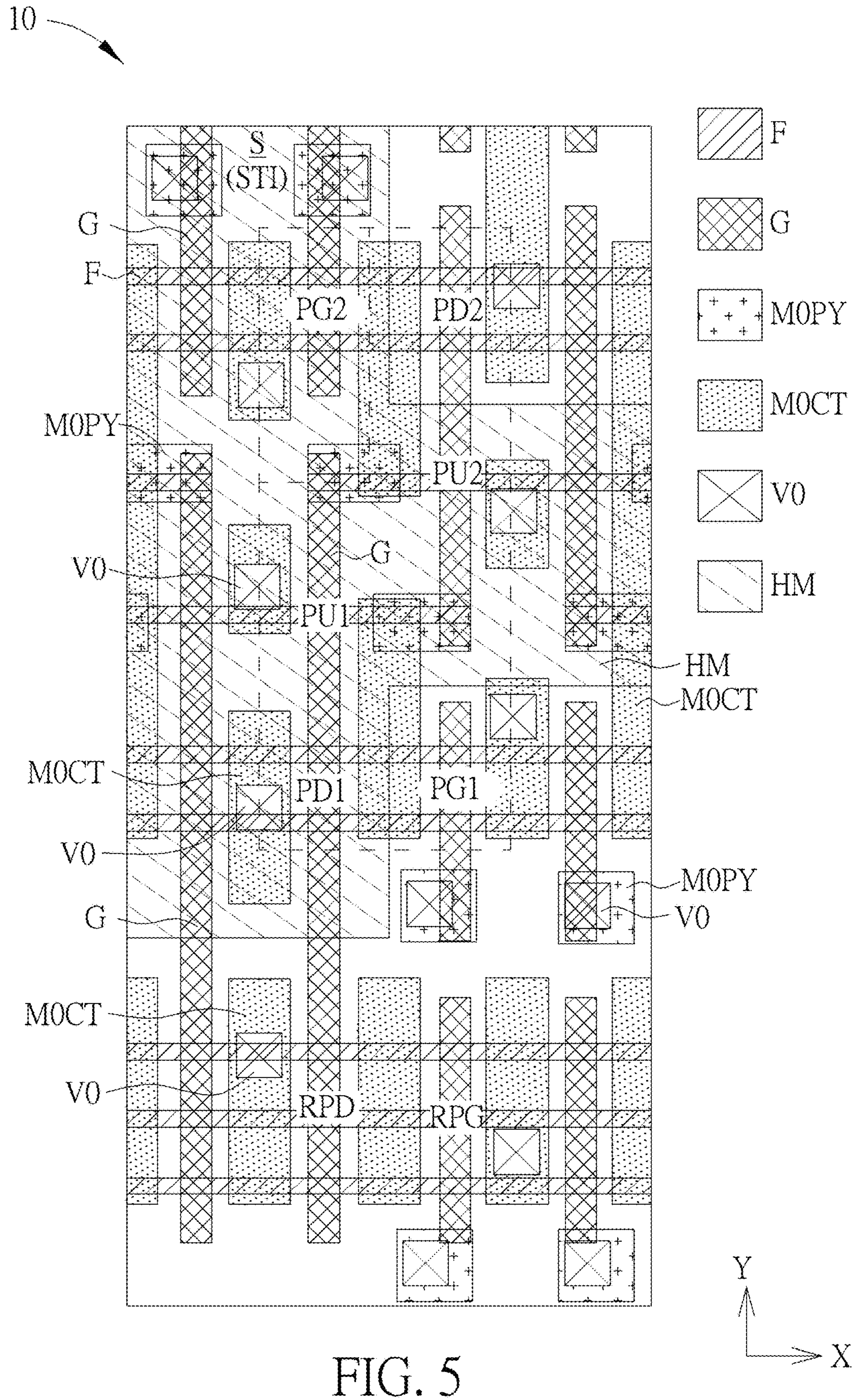
FIG. 5 is an example layout diagram of the SRAM of the present invention after the hard mask layer is formed.

In the actual manufacturing process, FIG. 5 is an example layout diagram of the SRAM of the present invention after the hard mask layer is formed. As shown in FIG. 5, in order to remove the P type work function metal layer 25 of the gate structure G4 and the gate structure G5, the P type work function metal layer 25 can be formed in the gates of each transistor in the process, and then the first pull-up transistor PU1, the second pull-up transistor PU2, the first pull-down transistor PD1 and the second access transistor PG2 are covered with a hard mask layer HM. The first reading transistor RPD, the second reading transistor RPG, the first access transistor PG1 and the second pull-down transistor PD2 are exposed, and then an etching process is performed to remove the P type work function metal layer 25 in the first reading transistor RPD, the second reading transistor RPG, the first access transistor PG1 and the second pull-down transistor PD2. In this embodiment, the pattern of the hard mask layer HM has a plurality of right-angle boundaries, and the first reading transistor RPD, the second reading transistor RPG, the first access transistor PG1 and the second pull-down transistor PD2 are exposed. However, the present invention does not limit the pattern shape of the hard mask layer HM, and the shape of the specific hard mask layer can be adjusted as required.

According to the applicant's experimental results, the difference between the saturated drain current of the first access transistor PG1 and the saturated drain current of the second access transistor PG2 can be reduced by the above method, and the saturated drain current of the second pull-down transistor PD2 is also reduced compared with that of the first pull-down transistor PD1. Improve the current balance of the whole 8TRF-SRAM memory cell 10. In addition, in other embodiments of the present invention, the saturated drain current of each transistor can also be fine-tuned, so as to make the current of the whole 8TRF-SRAM memory cell 10 more balanced. For example, in the above step of removing the P type work function metal layer 25, the P type work function metal layer 25 in the first access transistor PG1 and the second pull-down transistor PD2 may not be completely removed, but a part of the P type work function metal layer 25 may be left in the etching process, and the volume of the left P type work function metal layer 25 is small. This variation is also within the scope of the present invention.

According to the above description and drawings, the present invention provides a static random access memory (refer to the embodiment of FIG. 4), which at least includes a substrate S, a plurality of fin structures F located on the substrate S, and a plurality of gate structures G located on the substrate S and spanning the fin structures F to form a plurality of transistors distributed on the substrate, wherein each transistor includes a part of the gate structure G spanning the part of the fin structures F, wherein a plurality of transistors comprise a first pull-up transistor (PU1), a first pull-down transistor (PD1), a second pull-up transistor (PU2) and a second pull-down transistor (PD2) to form a latch circuit, and a first access transistor (PG1) and a second access transistor (PG2) are connected to the latch circuit. And a first reading transistor (RPD) and a second reading transistor (RPG) which are connected in series with each other, wherein the gate structure of the first reading transistor (RPD) is connected with the gate structure of the first pull-down transistor (PD1), wherein the first pull-down transistor (PD1) and the second access transistor (PG2) each include a gate structure (such as the gate structure G2 in FIG. 4), in which the gate structures G2 of the first pull-down transistor (PD1), the second pull-down transistor (PD2), the first access transistor (PG1) and the second access transistor (PG2) each include a P type work function metal layer 25, and an N type work function metal layer 26 is located on the P type work function metal layer 25.

In some embodiments of the present invention, in the gate structure G2 of the first pull-down transistor (PD1) and the second access transistor (PG2), the material of the P type work function metal layer 25 comprises titanium nitride, and the material of the N type work function metal layer 26 comprises titanium aluminide.

In some embodiments of the present invention, the P type work function metal layer 25 directly contacts the N type work function metal layer 26.

In some embodiments of the present invention, the gate structures G2 respectively included in the first pull-down transistor (PD1) and the second access transistor (PG2) further include a bottom barrier layer 24 below the P type work function metal layer 25, a diffusion barrier layer 27 above the N type work function metal layer 26, and an electrode layer 28 above the diffusion barrier layer 27.

In some embodiments of the present invention, the bottom barrier layer 24 comprises a stacked structure of a titanium nitride layer 24A and a tantalum nitride layer 24B, the tantalum nitride layer 24B is located above the titanium nitride layer 24A, and the tantalum nitride layer 24B directly contacts the P type work function metal layer 25.

In some embodiments of the present invention, in which the diffusion barrier layer 27 comprises titanium nitride, the diffusion barrier layer 27 directly contacts the N type work function metal layer 26.

In some embodiments of the present invention, the material of the electrode layer 28 comprises tungsten or aluminum.

In some embodiments of the present invention, the first reading transistor (RPD) and the second reading transistor (RPG) each include a gate structure G3, the second pull-down transistor (PD2) includes a gate structure G4, and the first access transistor (PG1) includes a gate structure G5. And the gate structures G3,G4 and G5 of the first reading transistor (RPD), the second reading transistor (RPG), the second pull-down transistor (PD2) and the first access transistor (PG1) each include an N type work function metal layer 26, and a bottom barrier layer 24 is located below the N type work function metal layer 26.

In some embodiments of the present invention, in the respective gate structures G3, G4 and G5 of the first reading transistor (RPD), the second reading transistor (RPG), the second pull-down transistor (PD2) and the first access transistor (PG1), the bottom barrier layer 24 comprises a stacked structure of a titanium nitride layer 24A and a tantalum nitride layer 24B, the tantalum nitride layer 24B is located above the titanium nitride layer 24A, and the tantalum nitride layer 24B directly contacts the N type work function metal layer 26 (as shown in FIG. 4, In the gate structures G3, G4, G5 do not include the P type work function metal layer 25, so the N type work function metal layer 26 directly contacts the tantalum nitride layer 24B).

In some embodiments of the present invention, the first pull-up transistor (PU1) and the second pull-up transistor (PU2) each include a gate structure G1, and the gate structures G1 of the first pull-up transistor (PU1) and the second pull-up transistor (PU2) each include an N type work function metal layer 26 and a P type work function metal layer 25.

In some embodiments of the present invention, a thickness of the P type work function metal layer 25 in the gate structure G1 of the first pull-up transistor (PU1) is greater than a thickness of the P type work function metal layer 25 in the gate structure G2 of the first pull-down transistor (PD1).

The present invention also provides a manufacturing method for forming a static random access memory (refer to the embodiment in FIGS. 2-4), which at least includes providing a substrate S, forming a plurality of fin structures F located on the substrate S, and forming a plurality of gate structures G located on the substrate S and spanning the fin structures F to form a plurality of transistors distributed on the substrate, wherein each transistor includes a part of the gate structure G spanning the part of the fin structures F, wherein a plurality of transistors comprise a first pull-up transistor (PU1), a first pull-down transistor (PD1), a second pull-up transistor (PU2) and a second pull-down transistor (PD2) to form a latch circuit, and a first access transistor (PG1) and a second access transistor (PG2) are connected to the latch circuit. And a first reading transistor (RPD) and a second reading transistor (RPG) which are connected in series with each other, wherein the gate structure of the first reading transistor (RPD) is connected with the gate structure of the first pull-down transistor (PD1), wherein the first pull-down transistor (PD1) and the second access transistor (PG2) each include a gate structure (such as the gate structure G2 in FIG. 4), in which the gate structures G2 of the first pull-down transistor (PD1), the second pull-down transistor (PD2), the first access transistor (PG1) and the second access transistor (PG2) each include a P type work function metal layer 25, and an N type work function metal layer 26 is located on the P type work function metal layer 25.

The applicant found that there is still room for improvement in the leakage current of the current static random access memory, in which the fin structure spanned by some transistors in the static random access memory is cut off due to the layout pattern, which leads to the difference in the passing currents of the two pull-down transistors in the static random access memory, and similarly, the difference in the passing currents of the two access transistors, which leads to the current imbalance of the whole static random access memory and further affects the performance of the static random access memory. By reducing the P type work function metal layer of some N type transistors, the invention further improves the saturation current of some N type transistors. By adjusting the saturation current of some N type transistors, the current of the whole SRAM can be balanced, thus improving the stability and performance of the SRAM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM), at least comprising:
- a substrate;
- a plurality of fin structures located on the substrate;
- a plurality of gate structures located on the substrate and span the plurality of fin structures to form a plurality of transistors distributed on the substrate, wherein each transistor comprises a part of the gate structure spanning a part of the fin structure, and the plurality of transistors comprise:
  - a first pull-up transistor (PU1), a first pull-down transistor (PD1), a second pull-up transistor (PU2) and a second pull-down transistor (PD2) together form a latch circuit;
  - a first access transistor (PG1) and a second access transistor (PG2) connected to the latch circuit; and
  - a first reading transistor (RPD) and a second reading transistor (RPG) connected in series, wherein the gate structure of the first reading transistor (RPD) is connected to the gate structure of the first pull-down transistor (PD1);
  - wherein the first pull-down transistor (PD1) and the second access transistor (PG2) each comprise a gate structure, wherein the gate structures of the first pull-down transistor (PD1) and the second access transistor (PG2) each include a P type work function metal layer, and an N type work function metal layer is located on the P type work function metal layer; and
  - wherein the gate structures of the first pull-down transistor (PD1) and the second access transistor (PG2) each further comprise a bottom barrier layer under the P type work function metal layer, a diffusion barrier layer disposed on the N type work function metal layer, and an electrode layer disposed on the diffusion barrier layer, and wherein the bottom barrier layer comprises a stacked structure of a titanium nitride layer and a tantalum nitride layer, the tantalum nitride layer is located above the titanium nitride layer, and the tantalum nitride layer directly contacts the P type work function metal layer.

2. The SRAM according to claim 1, wherein in the gate structures of the first pull-down transistor (PD1) and the second access transistor (PG2), the material of the P type work function metal layer comprises titanium nitride, and the material of the N type work function metal layer comprises titanium aluminide.

3. The SRAM according to claim 2, wherein the P type work function metal layer directly contacts the N type work function metal layer.

4. The SRAM according to claim 1, wherein the diffusion barrier layer comprises titanium nitride, and the diffusion barrier layer directly contacts the N type work function metal layer, and the material of the electrode layer comprises tungsten or aluminum.

5. The SRAM according to claim 1, wherein the second pull-down transistor (PD2), the first access transistor (PG1), the first reading transistor (RPD) and the second reading transistor (RPG) each comprise a gate structure, and the gate structures of the second pull-down transistor (PD2), the first access transistor (PG1), the first reading transistor (RPD) and the second reading transistor (RPG) each comprise an N type work function metal layer, and a bottom barrier layer is located below the N type work function metal layer.

6. The SRAM according to claim 5, wherein in the gate structures of the second pull-down transistor (PD2), the first access transistor (PG1), the first reading transistor (RPD) and the second reading transistor (RPG), the bottom barrier layer comprises a stacked structure of a titanium nitride layer and a tantalum nitride layer, the tantalum nitride layer is located above the titanium nitride layer, and the tantalum nitride layer directly contacts the N type work function metal layer.

7. The SRAM according to claim 1, wherein the first pull-up transistor (PU1) and the second pull-up transistor (PU2) each comprise a gate structure, and the gate structures of the first pull-up transistor (PU1) and the second pull-up transistor (PU2) each comprise an N type work function metal layer and a P type work function metal layer.

8. The SRAM according to claim 7, wherein a thickness of the P type work function metal layer in the gate structure of the first pull-up transistor (PU1) is greater than a thickness of the P type work function metal layer in the gate structure of the first pull-down transistor (PD1).

9. A manufacturing method for forming a static random access memory (SRAM), comprising at least:
- providing a substrate;
- forming a plurality of fin structures located on the substrate;
- forming a plurality of gate structures located on the substrate and span the plurality of fin structures to form a plurality of transistors distributed on the substrate, wherein each transistor comprises a part of the gate structure spanning a part of the fin structure, and the plurality of transistors comprise:
  - a first pull-up transistor (PU1), a first pull-down transistor (PD1), a second pull-up transistor (PU2) and a second pull-down transistor (PD2) together form a latch circuit;
  - a first access transistor (PG1) and a second access transistor (PG2) connected to the latch circuit; and
  - a first reading transistor (RPD) and a second reading transistor (RPG) connected in series, wherein the gate structure of the first reading transistor (RPD) is connected to the gate structure of the first pull-down transistor (PD1);

wherein the first pull-down transistor (PD1) and the second access transistor (PG2) each comprise a gate structure, wherein the gate structures of the first pull-down transistor (PD1) and the second access transistor (PG2) each include a P type work function metal layer, and an N type work function metal layer is located on the P type work function metal layer; and wherein the gate structures of the first pull-down transistor (PD1) and the second access transistor (PG2) each further comprise a bottom barrier layer under the P type work function metal layer, a diffusion barrier layer disposed on the N type work function metal layer, and an electrode layer disposed on the diffusion barrier layer, and wherein the bottom barrier layer comprises a stacked structure of a titanium nitride layer and a tantalum nitride layer, the tantalum nitride layer is located above the titanium nitride layer, and the tantalum nitride layer directly contacts the P type work function metal layer.

10. The manufacturing method for forming a SRAM according to claim 9, wherein in the gate structures of the first pull-down transistor (PD1) and the second access transistor (PG2), the material of the P type work function metal layer comprises titanium nitride, and the material of the N type work function metal layer comprises titanium aluminide.

11. The manufacturing method for forming a SRAM according to claim 10, wherein the P type work function metal layer directly contacts the N type work function metal layer.

12. The manufacturing method for forming a SRAM according to claim 9, wherein the diffusion barrier layer comprises titanium nitride, and the diffusion barrier layer directly contacts the N type work function metal layer, and the material of the electrode layer comprises tungsten or aluminum.

13. The manufacturing method for forming a SRAM according to claim 9, wherein the second pull-down transistor (PD2), the first access transistor (PG1), the first reading transistor (RPD) and the second reading transistor (RPG) each comprise a gate structure, and the gate structures of the second pull-down transistor (PD2), the first access transistor (PG1), the first reading transistor (RPD) and the second reading transistor (RPG) each comprise an N type work function metal layer, and a bottom barrier layer is located below the N type work function metal layer.

14. The manufacturing method for forming a SRAM according to claim 13, wherein in the gate structures of the second pull-down transistor (PD2), the first access transistor (PG1), the first reading transistor (RPD) and the second reading transistor (RPG), the bottom barrier layer comprises a stacked structure of a titanium nitride layer and a tantalum nitride layer, the tantalum nitride layer is located above the titanium nitride layer, and the tantalum nitride layer directly contacts the N type work function metal layer.

15. The manufacturing method for forming a SRAM according to claim 9, wherein the first pull-up transistor (PU1) and the second pull-up transistor (PU2) each comprise a gate structure, and the gate structures of the first pull-up transistor (PU1) and the second pull-up transistor (PU2) each comprise an N type work function metal layer and a P type work function metal layer.

16. The manufacturing method for forming a SRAM according to claim 9, wherein a thickness of the P type work function metal layer in the gate structure of the first pull-up transistor (PU1) is greater than a thickness of the P type work function metal layer in the gate structure of the first pull-down transistor (PD1).

* * * * *